United States Patent
Stacy et al.

(10) Patent No.: US 11,562,885 B2
(45) Date of Patent: Jan. 24, 2023

(54) PARTICLE YIELD VIA BEAM-LINE PRESSURE CONTROL

(71) Applicant: Applied Materials, Inc., Santa Clara, CA (US)

(72) Inventors: Thomas Stacy, Beverly, MA (US); Jay T. Scheuer, Rowley, MA (US); Eric D. Hermanson, Georgetown, MA (US); Bon-Woong Koo, Andover, MA (US); Tseh-Jen Hsieh, Rowley, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/351,842

(22) Filed: Jun. 18, 2021

(65) Prior Publication Data
US 2022/0037114 A1 Feb. 3, 2022

Related U.S. Application Data

(60) Provisional application No. 63/057,640, filed on Jul. 28, 2020.

(51) Int. Cl.
*H01J 37/05* (2006.01)
*H01J 37/301* (2006.01)
*H01J 37/317* (2006.01)

(52) U.S. Cl.
CPC ............ *H01J 37/301* (2013.01); *H01J 37/05* (2013.01); *H01J 37/3171* (2013.01); *H01J 2237/30472* (2013.01)

(58) Field of Classification Search
CPC ...... H01J 37/301; H01J 37/05; H01J 37/3171; H01J 2237/30472; H01J 37/304; H01J 2237/006; H01J 2237/31705
See application file for complete search history.

(56) References Cited

U.S. PATENT DOCUMENTS

| | | | |
|---|---|---|---|
| 4,680,474 A * | 7/1987 | Turner | H01J 37/3171 414/217 |
| 6,396,215 B1 * | 5/2002 | Matsuda | H01J 37/3171 315/111.81 |
| 9,685,298 B1 | 6/2017 | Likhanskii et al. | |

(Continued)

FOREIGN PATENT DOCUMENTS

| KR | 1020160042312 B1 | 4/2016 |
|---|---|---|
| TW | 201807735 A | 3/2018 |

OTHER PUBLICATIONS

International Search Report and Written Opinion dated Oct. 27, 2021, for the International Patent Application No. PCT/US21/40482, filed on Jul. 6, 2021, 7 pages.

*Primary Examiner* — Michael Maskell
(74) *Attorney, Agent, or Firm* — KDB Firm PLLC (57) ABSTRACT

A beamline ion implanter and a method of operating a beamline ion implanter. A method may include performing an ion implantation procedure during a first time period on a first set of substrates, in a process chamber of the ion implanter, and performing a first pressure-control routine during a second time period by: introducing a predetermined gas to reach a predetermined pressure into at least a downstream portion of the beam-line for a second time period. The method may include, after completion of the first pressure-control routine, performing the ion implantation procedure on a second set of substrates during a third time period.

20 Claims, 4 Drawing Sheets

(56) References Cited

U.S. PATENT DOCUMENTS

| | | |
|---|---|---|
| 9,761,410 B2 | 9/2017 | Likhanskii et al. |
| 10,522,330 B2 | 12/2019 | Anglin et al. |
| 2013/0320854 A1 | 12/2013 | Kurunczi et al. |
| 2014/0273420 A1* | 9/2014 | Cheng ................. H01J 37/3171 118/712 |
| 2017/0221678 A1* | 8/2017 | Likhanskii .......... H01J 37/3007 |

* cited by examiner

PARTICLE YIELD VIA BEAM-LINE PRESSURE CONTROL

RELATED APPLICATIONS

This application claims priority to U.S. provisional application 63/057,640, entitled "IMPROVING PARTICLE YIELD VIA BEAM-LINE PRESSURE CONTROL," filed Jul. 28, 2020, and incorporated by reference herein in its entirety.

The disclosure relates generally to apparatus and techniques for implanting substrates, and more particularly, to improved beam-line ion implanter particle yield.

FIELD OF THE DISCLOSURE

The disclosure relates generally to apparatus and techniques for implanting substrates, and more particularly, to improved beam-line ion implanter particle yield.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties.

Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

In many ion implanters a downstream electrostatic module, may function as an electrostatic lens to control ion beam energy, ion beam shape, and ion beam size. The electrostatic module may accelerate or decelerate an ion beam to a final energy, while altering the direction of the ion beam. By altering the direction of the ion beam, energetic neutrals may be screened out, resulting in a final beam having a well-defined energy.

Known electrostatic modules may employ, for example, multiple pairs of electrodes, such as seven upper and lower electrodes arranged in pairs, where the electrodes bound and guide an ion beam traveling therethrough. The electrodes may be arranged as rods spaced equidistant from an ion beam. The rod/electrode potentials are set to create electric fields in the electrostatic module causing the ion beam to decelerate, deflect and focus the ion beam.

Some beam-line implanters are designed for high throughput in that relatively higher beam currents are used to rapidly perform implantation of a targeted dose of ions into a substrate. For productivity purposes, a greater number of substrates may be targeted for implantation between maintenance or other scheduled downtime. For example, thousands or tens of thousands of substrates may be implanted between periods of scheduled maintenance.

One of the main concerns during operation of a beam-line ion implanter, such as a high current implanter, is the ability to maintain operating conditions that generate a high device yield on substrates, such as semiconductor wafers, that are implanted. One ongoing challenge is the appearance of particle or particulate defects on substrates after implantation. Routine or non-routine cleaning of the beam-line may be performed to reduce particle contamination, at the cost of lost productivity due to necessary downtime for cleaning.

With respect to these and other considerations, the present disclosure is provided.

SUMMARY

In one embodiment, a method of operating a beamline ion implanter is provided. The method may include performing an ion implantation procedure during a first time period on a first set of substrates, in a process chamber of the ion implanter. The method may further include performing a first pressure-control routine during a second time period by: introducing a predetermined gas to reach a predetermined pressure into at least a downstream portion of the beam-line for a second time period. The method may also include, after completion of the first pressure-control routine, performing the ion implantation procedure on a second set of substrates during a third time period.

In another embodiment, a beamline ion implanter is provided. The ion implanter may include an ion source to generate an ion beam according to an ion implantation procedure. The ion implanter may include a set of components to conduct the ion beam along a beam-line to a process chamber. The ion implanter may also include a pressure-control system, comprising an isolation valve and at least one inlet, disposed downstream of the isolation valve, to conduct a predetermined gas into a downstream portion of the beam-line, and a controller, wherein the controller is arranged to direct the beamline ion implanter to perform a pressure-control cycle. The pressure control cycle may include performing the ion implantation procedure during a first time period on a first plurality of substrates, in the process chamber, and performing a first pressure-control routine during a second time period by introducing a predetermined gas to reach a predetermined pressure into at least a downstream portion of the beam-line for a second time period. The pressure control cycle may further include, after completion of the first pressure-control routine, performing the ion implantation procedure on a second plurality of substrates during a third time period.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

A system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved operation and reduced defects in substrates processed in an ion implanter.

Figure 1:
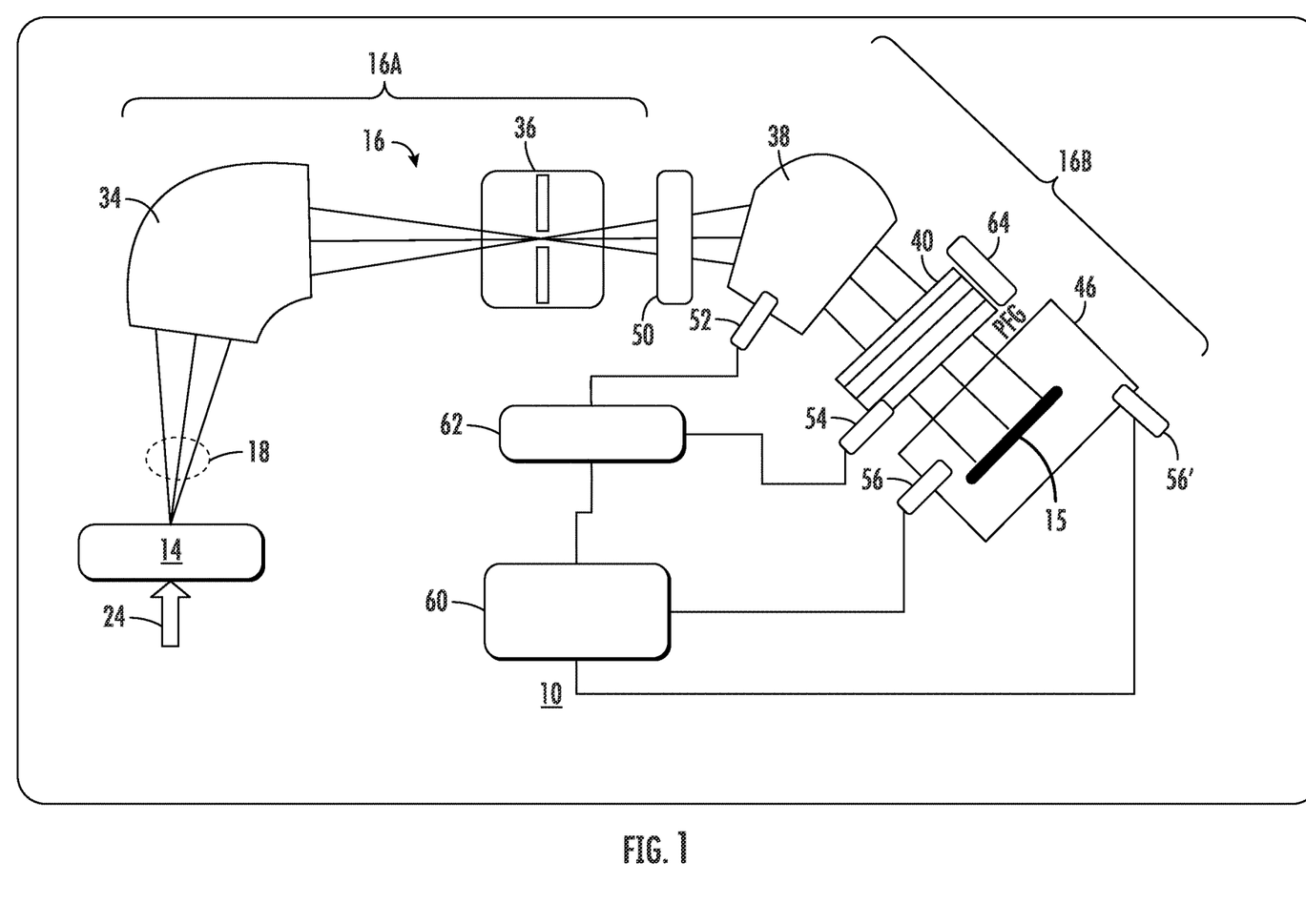
FIG. 1 shows an exemplary embodiment demonstrating an ion implantation system, according to embodiments of the disclosure.

Referring now to FIG. 1, an exemplary embodiment demonstrating a system 10 is shown, where the system 10 may be used as a beam-line ion implanter, or "ion implanter," for ion implantation in accordance with the present disclosure. Generally, a beamline ion implanter according to the present embodiments will include an ion source and a set of components to conduct the ion beam along a beam-line to a process chamber. In the example of FIG. 1, the system 10 includes, among other components, an ion source 14 for producing an ion beam 18, such as a ribbon beam or a spot beam, and a series of beam-line components. The ion source 14 may comprise a chamber for receiving a flow of gas 24 to generate ions. The ion source 14 may also comprise a power source and an extraction electrode assembly disposed near the chamber. In some non-limiting embodiments, the beam-line components may include, for example, a mass analyzer 34, a mass-resolving slit (MRS) chamber 36, and a collimator 38, disposed upstream of an energy filter 40, which filter may provide deceleration and/or acceleration of the ion beam 18.

In exemplary embodiments, the components of the beam-line 16 may filter, focus, and manipulate ions or the ion beam 18 to have a species, shape, energy, and/or other qualities. The ion beam 18 passing through the beam-line 16 may be directed toward a substrate 15 mounted on a platen or clamp within a process chamber 46, or endstation. The substrate 15 may be moved in one or more dimensions (e.g., translate, rotate, and tilt).

The energy filter 40 is a beam-line component configured to independently control deflection, deceleration, and focus of the ion beam 18. In some embodiments, the energy filter 40 is a vertical electrostatic energy filter (VEEF) or electrostatic filter EF. The energy filter 40 may be arranged as an electrode assembly defining at least one electrode configuration. The electrode configuration may include a plurality of electrodes arranged in series along the beam-line 16 to process the ion beam 18 through the energy filter 40. In some embodiments, the electrostatic filter may include a set of upper electrodes disposed above the ion beam 18 and a set of lower electrodes disposed below the ion beam 18, to conduct the ion beam, shape the ion beam 18, and accelerate/decelerate the ion beam 18 before impacting substrate 15.

In operation, the system 10 may operate to implant a series of substrates, such as semiconductor wafers. The substrate 15 may be one of a series of substrates that are loaded in serial fashion for implantation, as in known ion implanters. In a high throughput mode of operation, the system 10 may operate to implant thousands or tens of thousands of substrates between intervals of scheduled downtime.

The system 10 may include components to address a concern encountered during high throughput operation, namely, the ability to maintain defects at the substrate 15 at or below an acceptable level. As shown in FIG. 1, the system 10 may include an isolation valve 50, where the isolation valve 50 is located upstream of the process chamber 46, such as between the mass-resolving slit (MRS) chamber 36 and collimator 38. The isolation valve 50 may serve to isolate the evacuated region of a downstream portion 16B of the beam-line 16, from the evacuated region of an upstream portion 16B of the beam-line 16. While not explicitly shown, the beam-line 16 includes an evacuated central enclosure or set of contiguous chambers that is configured to conduct the ion beam 18 from ion source 14 to substrate 15, with an operating pressure generally below 1 Torr. The isolation valve 50 may allow the downstream portion 16B to be separately vented from the upstream portion 16A, for example. While in FIG. 1 the isolation valve 50 is located between mass-resolving slit (MRS) chamber 36 and collimator 38, in other embodiments, the isolation valve 50 may be shifted upstream or downstream of the location shown, or more than one of the isolation valve 50 may be placed along the beamline. For example, an isolation valve 50 may be placed between collimator 38 and energy filter 40, or between energy filter 40 and process chamber 46.

The system 10 may also include various inlets, such as and at least one inlet, disposed downstream of the isolation valve, to conduct a gas into a downstream portion of the beam-line 16. As shown in FIG. 1, a collimator inlet 52, an energy filter inlet 54, and a process chamber inlet, or process chamber vent 56 are provided, which components may be used to conduct gas into and out of locations downstream of the isolation valve 50. The process chamber vent 56 is shown as being located near a front side of the substrate 15, while in some embodiments, a process chamber vent, shown as process chamber vent 56', is located toward a back side of the substrate 15, as also depicted in FIG. 1. For example, at suitable instances, when ion implantation is not taking place, a given pressure of a bleed gas, such as nitrogen, air, water vapor, a reactive gas, or other gas, may be provided through one or more of the inlets or vents. In one example, the energy filter inlet 54 may be located next to the energy filter 40 or next to a plasma flood gun (the location of the plasma flood gun is designated by PFG) that is just downstream of the chamber of the energy filter 40. In some examples, one or more vents, such as the process chamber vent 56, may be coupled to a pump. As such, at a given interval after ion implantation has taken place, gas may be bled into the downstream portion 16B at one or more locations, after the isolation valve 50 is engaged to isolate the upstream portion 16A.

In particular, according to embodiments of the disclosure, as detailed below, a pressure-control routine may be applied to one or more locations of the beamline, such as in the downstream portion 16B. The pressure-control routine may involve introducing a gas into the beamline to reach a predetermined pressure for a predetermined interval, before evacuation of the gas from the given portion of the beamline and the reestablishing of implantation conditions. As noted above, one or more of the isolation valve 50 may be placed at different locations along the beamline. In this manner, one or more components of the downstream portion 16B may be isolated from other components of the beamline, so that the targeted component may be individually subject to a pressure-control routine. Advantages of this procedure are explained with respect to the figures to follow.

In some embodiments, the system 10 may include a controller 60, coupled to the inlets, such as through a gas manifold 62 to direct one or more gas species into the downstream portion 16B. The controller 60 may further be coupled to vents of the downstream portion, so that cycling gas into and out of the downstream portion 16B may be controlled as desired. The controller 60 may be arranged to direct a pressure-control routine as detailed below. In at least that regard, the controller 60 may include appropriate hardware components, such as memory, one or more processors, interfaces, etc. to generate, transmit, receive, signals for executing the pressure-control routine.

In some embodiments, an energetic discharge source may be provided in the downstream portion 16B to generate plasma species, such as ions, metastable species, radical species, or molecular species that may be used to impact internal surfaces of targeted regions of the downstream portion 16B, including, for example, the electrostatic energy filter 40. An example of a discharge source is shown as a remote plasma source 64, positioned adjacent to the energy filter 40.

In accordance with embodiments of the disclosure, the pressure in the beam-line 16, such as in the downstream portion 16B, may be controlled in a manner to periodically flow a designated gas or gases into or out of regions proximate the substrate 15, such as the region PFG of a plasma flood gun, or the process chamber 46, or collimator 38. The present inventors have discovered that under certain conditions, particle count on substrates may accumulate to unacceptable levels during extended operation of implantation into substrates, where control of the beamline pressure in the downstream portion 16B may have a salutary effect on reducing particle count.

Figure 2A:
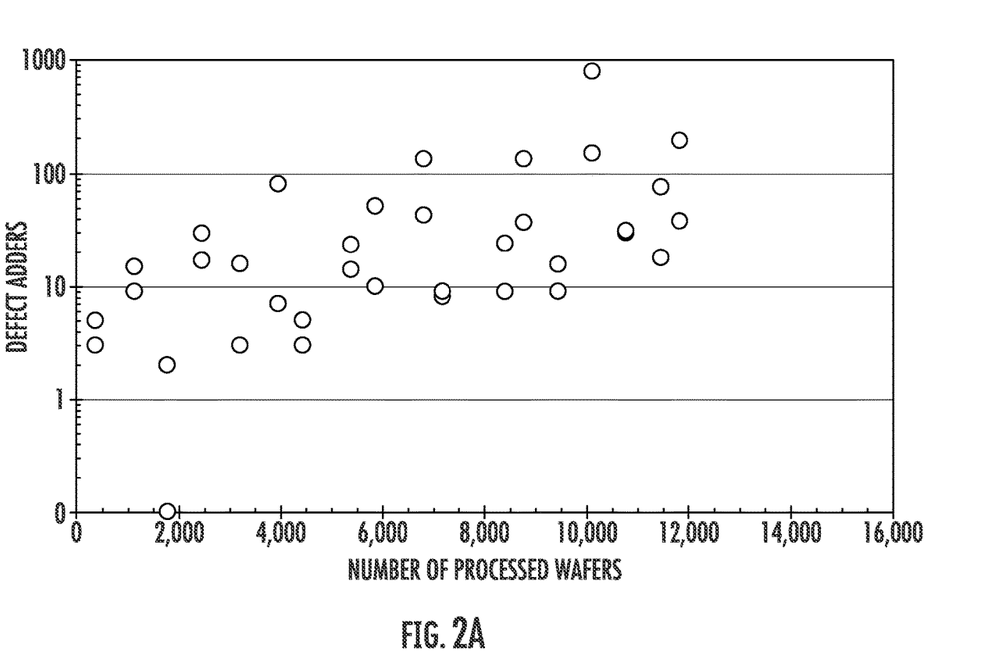
FIG. 2A illustrates defect behavior for implanted wafers as a function of wafer number in a dedicated mode.
Figure 2B:
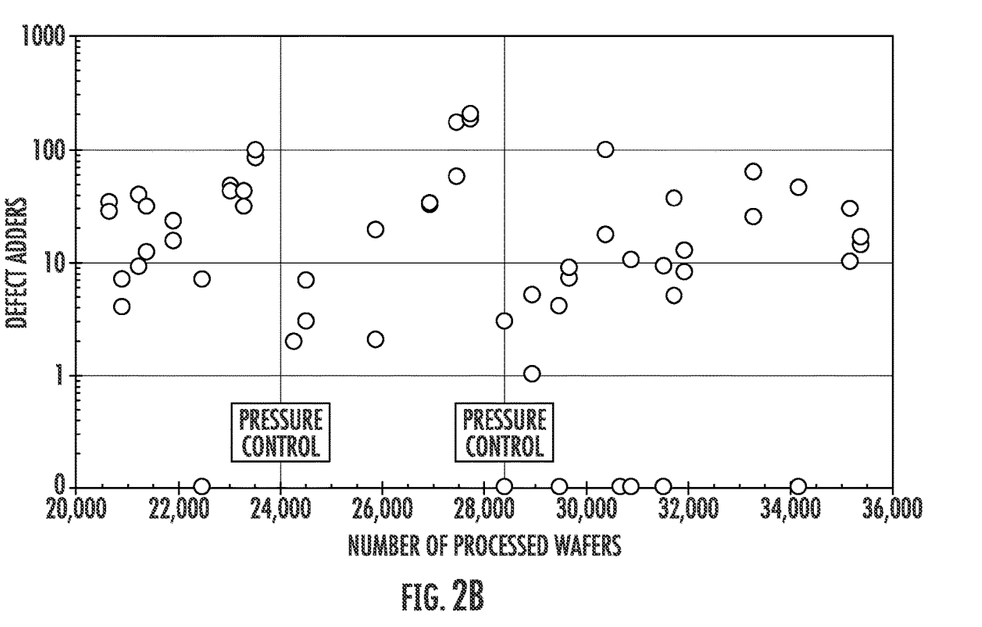
FIG. 2B illustrates defect behavior for implanted wafers as a function of wafer number for operation of an ion implanter in accordance with embodiments of the disclosure.

To highlight this behavior, FIG. 2A illustrates defect behavior for an ion implanted wafers as a function of wafer number during dedicated implant process. FIG. 2B illustrates defect behavior for an ion implanted wafers as a function of wafer number for operation of an ion implanter in accordance with embodiments of the disclosure. In these examples, a high current implantation apparatus is operated to implant a series of substrates in a dedicated mode, where the same implantation recipe is used to implant every wafer. In FIG. 2A, implantation of a series of wafers proceeds generally without interruption for a total of approximately 12,000 wafers, with measurement of defects (adders) performed at intervals of every few hundred to one thousand wafers. While there is some fluctuation in the defect level, the average defect level increases generally monotonically with increased wafer count, with a substantial fraction of measurements exceeding the acceptable limit. Thus, dedicated use of the ion implanter may generate unacceptable levels of defects over time, and accordingly presents a challenge for high throughput implantation of phosphorous wafers Turning now to FIG. 2B there is shown the results of a "marathon" of a dedicated ion implantation where no other implantation recipe is used, as in the case of FIG. 2A. Different from the protocol of FIG. 2A, in the example, of FIG. 2B, at certain intervals, the ion implantation is paused and the beam-line is pressure-controlled with nitrogen gas, before the beam-line is pumped down and implantation is resumed. The pressure-control routine of FIG. 2A involves introducing nitrogen gas into the beamline for an interval, before evacuation of the beamline and reestablishing implantation conditions takes place. In some non-limiting examples, the nitrogen gas is introduced to reach a predetermined pressure in the beamline, such as one or more regions of the downstream portion 16B, where the pressure is increased to several Torr, several hundred Torr, or one atmosphere pressure. This pressure may be maintained for a duration of one minute to one hour or so according to different embodiments of the disclosure. The data of FIG. 2 represents data where the pressure-control routine involves admitting nitrogen to a pressure of one atmosphere. Measurements of wafers implanted at different instances are taken, similarly to the procedure in FIG. 2A up to a total of ~16,000 wafers. As in the case of FIG. 2A, the defect yield tends to increase with increased wafer count. For example, between 20,000 wafer count and 24,000 wafer count, the defect yield increases with increased wafer count, before a first intentional pressure-control routine is performed on the beam-line using nitrogen at approximately 24,000 wafer count. When implantation is resumed at 24,000 wafer count, particle performance instantaneously improves by ~2 orders of magnitude, dropping from ~100 to ~1. Particle count then increases with increased wafer count and exceeds a value of 100 at approximately 27,000 wafer count. At approximately 28,000 wafer count a second intentional pressure-control procedure is performed on the beam-line using nitrogen. When implantation is resumed at 28,000 wafer count, particle performance (defects/adders) again significantly instantaneously improves by ~2 orders of magnitude, dropping from ~200 to ~1. Again, defect yield increases with increased wafer count up to 35,000 wafer count, reaching levels approaching the acceptable limit of 50. However, the overall increase in defects with increased wafer count is not monotonic, but rather is instantaneously reset to a much lower value upon performant In accordance with these results, controlling of the beam-line pressure of a high current implanter may be provided at determined intervals during extended operation of implantation of substrates to limit the defect level in implanted substrates over time. In the example of FIGS. 2A and 2B high current dedicated implantation results are shown for a given implant species. However, other high current implantation of other species may also result in increased defect generation over time, and may benefit from periodically performing a pressure-control routine for at least a portion of a beam-line, such as a downstream portion of the beam-line. In the example of dedicated implantation of FIG. 2B, a pressure-control threshold may be set so as to pause implantation operation at a point where the determined or calculated defect level approaches an acceptable limit. Thus, in the example of FIG. 2B, when pressure-controlling is performed at intervals of every ~4000 wafers, the particle (defect) count may be expected to be less than or equal to 100. Thus, if a value of 100 represent an acceptable defect limit, performing of a pressure-control routine at intervals of ~4000 wafer intervals may maintain defect levels at or below the acceptable defect limit. Of course, for a different defect limit (either greater than 100 or less than 100), the size of the wafer interval that is implanted between performing of consecutive pressure-control routines may be increased or decrease.

According to additional embodiments of the disclosure, the interval for performing a pressure-control regime may be set according to total implanted dose. Note that for the data of FIG. 2B, each wafer is implanted with a dose equivalent to several times 1E15/cm2, meaning that the total implant dose for 4000 wafers is greater than $1E19/cm^2$. Without limitation as to any particular theory, the increase in particle count may be caused at least in part by an increase in an amount of deposit from ion species that collects in the beamline, where the amount of the deposit is proportional to total ion dose conducted through the beamline over time. Thus, instead of setting a threshold for performing a pressure-control routine based on number of implanted wafers, in some embodiments, this threshold may be set according to total implanted dose. While the total ion dose corresponding to the generation of defect levels that reach an acceptable limit may vary with implant species, this range may be between $1E18/cm^2$ and $5E20/cm^2$ and more particularly between $1E19/cm^2$ to $1E20/cm^2$ in some non-limiting embodiments. Thus, according to particular embodiments, the threshold for performing a pressure-control routine may be when a total ion dose generated to implant a plurality of substrates reaches between $1E18/cm^2$ and $1E20/cm^2$ and more particularly between $1E19/cm^2$ to $1E20/cm^2$.

In further embodiments, the interval or instance for performing a pressure-control procedure may be determined by measurement of film thickness of films that accumulate in the beamline from deposition of species during implantation, such as in an electrostatic filter or endstation of a beamline, where the film thickness measurement may be performed by known means. In further embodiments, the instance for performing a pressure-control routine may be triggered by current measurement of an electrostatic electrode such as a rod, within an electrostatic filter. Thus, when a difference in current collected on the electrodes reaches a threshold value the pressure-control routine may be performed. In one particular embodiment the instance for performing a pressure-control routine may be triggered by a capacitance measurement performed on rods (electrodes) of an electrostatic filter, where the capacitance value is indicative of film thickness accumulating on the electrodes. Thus, when the capacitance reaches a threshold value, the pressure-control routine may be initiated.

Figure 2C:
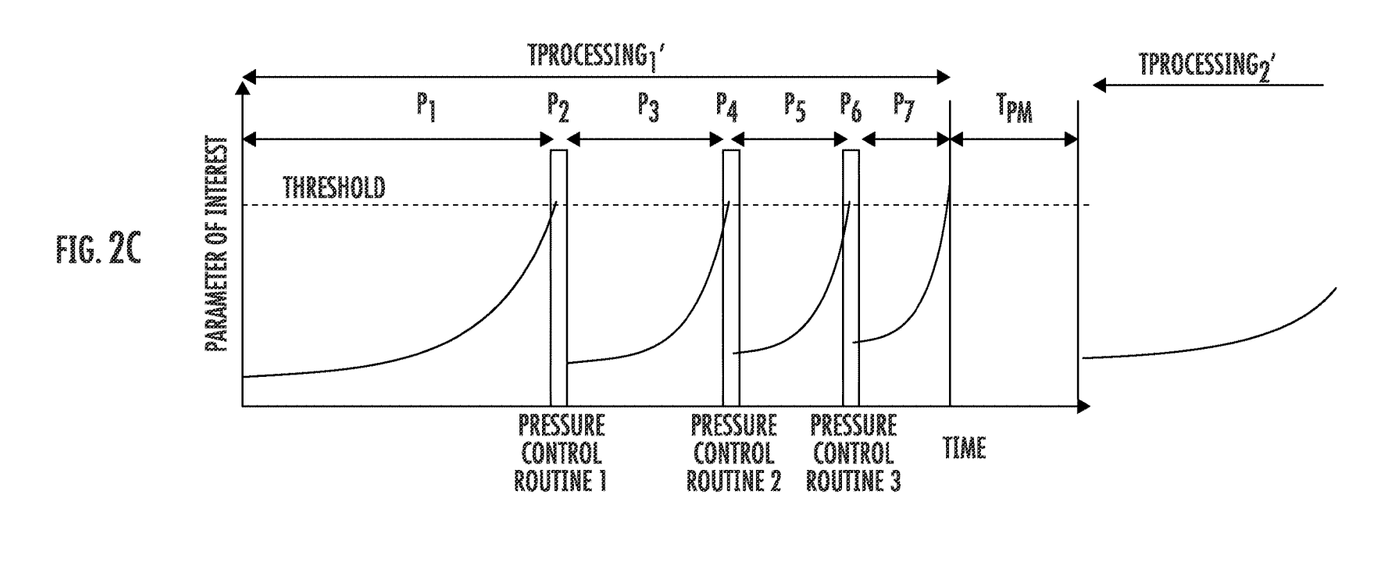
FIG. 2C is a schematic diagram illustrating principles of the application of a pressure-control cycle, in accordance with embodiments of the disclosure.

FIG. 2C is a schematic diagram illustrating principles of the application of a pressure-control cycle to improve substrate processing efficiency, in accordance with embodiments of the disclosure. In some examples, the pressure control cycle may be controlled at least in part by a controller 60 to direct various operations, as detailed below. FIG. 2C shows an entity that is termed $T_{processing}$, which parameter refers to the duration of total period of time that a beamline is operating between performance of preventative maintenance. The preventative maintenance is shown as $T_{PM}$ where the preventative maintenance requires shutting down the beamline, and opening various portions of the beamline for maintenance procedures, such as cleaning and/or replacing eroded parts. A useful result is to increase the length of the entity $T_{processing}$. In the example of FIG. 2C, cycling takes place between performing an ion implantation procedure on a first set of substrates during a first time period (shown as P1), and performing a first pressure-control routine during a second time period (shown as P2).

In one example, at a minimum, a pressure control cycle may constitute performing an ion implantation procedure on a first set of substrates during a first time period (shown as P1), performing a first pressure-control routine during a second time period (shown as P2), and performing the ion implantation on a second set of substrates, in a third time period, as represented by P3 in FIG. 4.

This cycling between performing an ion implantation procedure and performing a pressure-control routine may continue to be repeated, where additional cycles are represented in FIG. 2C, by P4, a fourth time period where a second pressure-control routine is performed; by P5, a fifth time period where the ion implantation procedure may be performed on a third set of substrates, and P6, a sixth time period where a third pressure-control routine is performed; and so forth. According to embodiments of the disclosure, the duration of a given ion implantation procedure may be determined by when a threshold is met or exceeded.

In the aforementioned examples, the threshold may represent a total number of substrates (wafers) being processed, a total ion implanted dose over a number of wafers, or a defect level. Thus, when the threshold condition is met may in some examples be established by predetermined criteria, such as number of substrates being processed, while in some examples when the threshold is met may be determined more dynamically. For example, the total implanted ion dose may be correlated with the number of substrates being processed, especially in the case where the same implantation recipe is repeated for each substrate, but the total implanted ion dose may be more accurately determined by measurement or recording of implantation of each substrate. Moreover, the use of defect level as a measure of the threshold may be performed dynamically in various manners, such as by a deposition sensor or a particle counter, disposed in the process chamber.

Returning now to FIG. 2C, the series of curves shown within a given implantation period represent schematically the increase in a parameter of interest, such as a measured deposit thickness in a process chamber, a particle count on the substrate, or other parameter. While in some examples of a threshold determination, the parameter of interest may increase linearly with time, such as number of substrates processed, in other examples, the parameter of interest may increase non-linearly with time. Under certain processing conditions, the present inventors have observed that parameters related to defect level may increase non-linearly with time, and in fact may increase more rapidly with increased time, as suggested in FIG. 2C. Thus, in FIG. 2C, at the end of the period P1, the parameter of interest increases more rapidly and reaches the threshold, at which point, the first pressure-control routine is initiated.

As further suggested in FIG. 2C, in some examples, the duration of successive implantation periods (P3, P5, etc.) may be reduced. In other words, during each successive implantation period, the threshold condition may be reached increasing more rapidly. At a given point, after at least one pressure-control routine is performed, the implanter may be shut down and a preventative maintenance period scheduled, shown by $T_{PM}$. Nonetheless, the performing of pressure-control routines as detailed above may still be more efficient than present day procedures where preventative maintenance may be scheduled based on fixed number of substrates or hours of implantation, or other criteria. Note that the duration of a pressure-control routine (P2, P4, P6) may be on the order of just one hour or less, while the duration of the preventative maintenance including the post conditioning time may be on the order of several hours to 12 hours, and the duration of the implantation periods may be on the order of many hours or tens of hours, such as 20-60 hours.

Figure 2D:
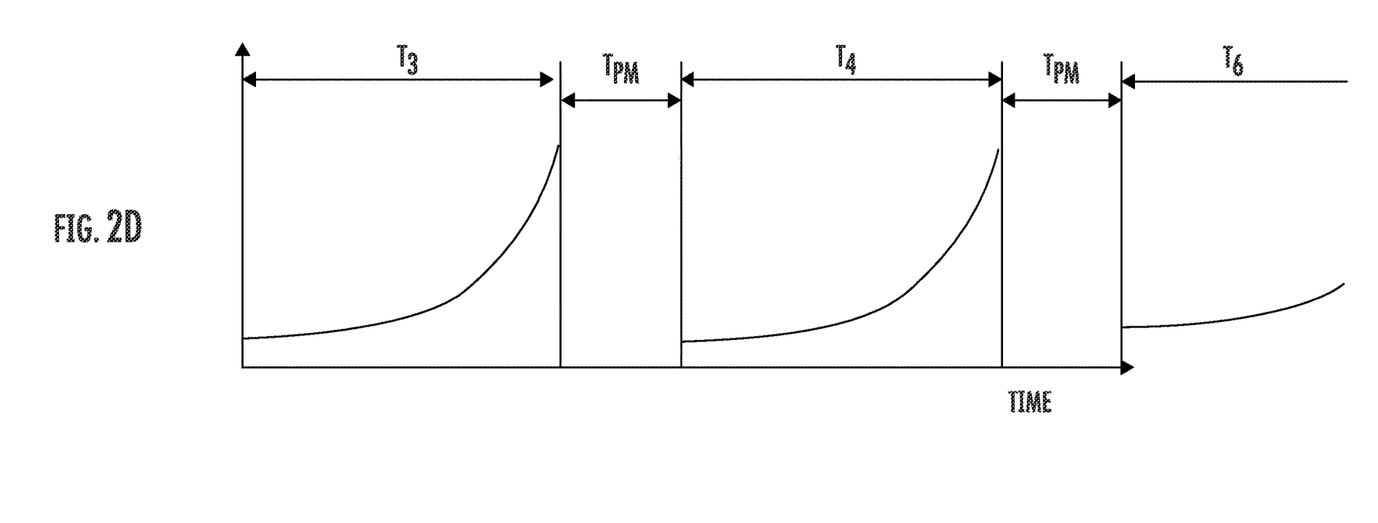
FIG. 2D is a schematic diagram illustrating a reference maintenance cycle for an ion implanter.

FIG. 2D is a schematic diagram illustrating the operation of an ion implanter according to a reference maintenance cycle. In this example, an ion implanter is cycled through periods of implantation and preventative maintenance (PM) while not performing a pressure-control routine of the present embodiments. As such, for a given implantation procedure, the ion implanter may be operated through successive implantation periods (shown as $T_4$, $T_5$, and $T_6$) where the duration of the implantation periods remains the same. The implantation periods are interspersed with a series of preventative maintenance periods, as shown. The preventative maintenance periods may be scheduled based upon an expectation of when cleaning and/or replacing of eroded or contaminated parts may be necessary due to accumulation of contaminants, as shown by the curves. A hallmark of the operation of the ion implanter according to FIG. 2D is that the relative duty cycle of implantation ON time during which periods implantation takes place is less than the duty cycle of implantation ON time for the embodiment of FIG. 2C. Moreover, the relative PM duty cycle of PM time, during which intervals preventative maintenance is taking place, is relatively higher in FIG. 2D than the PM duty cycle of FIG. 2C, meaning that relatively more time is spent performing maintenance in the reference case of FIG. 2D.

In other embodiments of the disclosure, in addition to periodic pressure control using a neutral gas, the use of a plasma source may be employed for generating a plasma (such as at a pressure of mTorr to atmospheric pressure) to generate species that modify films in regions proximate the substrate, including the electrostatic filter region, in order to further maintain particle level at acceptable levels. This plasma source may generate plasma species, such as ions, metastable species, radical species, or molecular species that may be used to impact internal surfaces of the beamline in conjunction with the application of a pressure-control routine, in order to more effectively remove material that may act as a source of particles.

Figure 3:
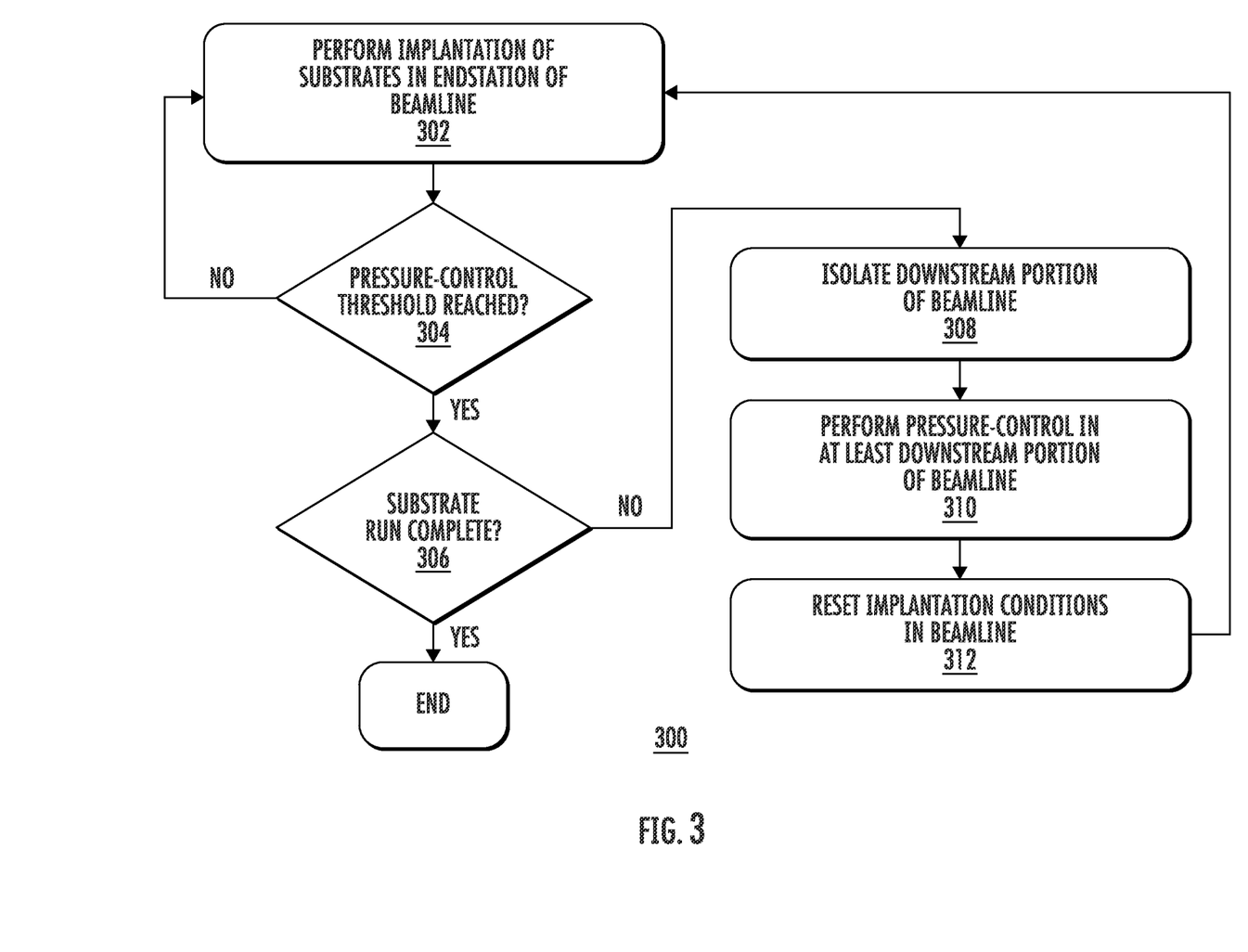
FIG. 3 illustrates an exemplary process flow.

FIG. 3 depicts an exemplary process flow, show as process flow 300. At block 302, a given substrate "run" is commenced where a series of substrates are implanted over a first interval in an endstation (process chamber) of a beam-line of an ion implantation system. In some non-limiting examples, the substrates may be wafers that are implanted using a dedicated recipe, such as boron, arsenic, carbon or phosphorous implantation. As such, the defect (particle) level may tend to increase with increasing wafer count during the substrate run.

At decision block 304, a periodic check may be made by the ion implantation system as to whether a pressure-control threshold has been reached. The pressure-control threshold may correspond to a predetermined number of wafers, or may correspond to a total ion dose performed over the first interval. The pressure-control threshold may represent a value beyond which value the particle level is expected to reach or exceed an acceptable limit. If not, the flow proceeds through block 302 and implantation continues.

If the pressure-control threshold has been reached, the flow proceeds to decision block 306, where a determination is made as to whether the substrate run is complete. If so, the flow ends and implantation terminates. If not, the flow proceeds to block 308.

At block 308, a downstream portion of the beam-line is isolated. The downstream portion of the beam-line may be isolated by engaging an isolation valve, located, for example, just upstream of a collimator.

At block 310, at least the downstream portion of the beam-line is pressure-controlled. For a given pressure of a bleed gas, such as nitrogen, air, water vapor, a reactive gas, or other gas, may be provided through one or more of inlets provided in the beam-line, such as in the downstream portion.

At block 312, implantation conditions are reset to resume implantation, such as a dedicated boron or phosphorous or carbon or arsenic ion implantation. The resetting may involve pumping out the bleed gas after a certain interval, such as one minute to one hour, then providing the implantation species to an ion source and resuming implantation.

In one variant of the process flow 300, the operation of block 308 may be skipped and the pressure controlling of the beam-line may take place over the entire beam-line in block 310.

The present embodiments provide at least the following advantages. A first advantage is that by performing a periodic pressure-control routine, the level of contamination in substrates being implanted may be maintained within an acceptable range for a larger number of substrates. Another advantage is that the frequency of expensive and time-consuming shutdown of a beamline and cleaning of beam-line parts may be reduced, since the pressure-control routine maintains lower levels of defects without beamline shutdown.

The present disclosure is not to be limited in scope by the specific embodiments described herein. Indeed, other various embodiments and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

The invention claimed is:

1. A method of operating a beamline ion implanter, comprising:
performing an ion implantation procedure during a first time period in a process chamber of the ion implanter, wherein a condition of the beamline ion implanter is monitored to determine when a threshold condition is met after implantation of a first plurality of substrates during the first time period;
when the threshold condition is met, performing a first pressure-control routine during a second time period by:
introducing a predetermined gas to reach a predetermined pressure into at least a downstream portion of the beamline for a second time period; and after completion of the first pressure-control routine, performing the ion implantation procedure on a second plurality of substrates during a third time period.

2. The method of claim 1, wherein the predetermined gas is nitrogen, Ar, Kr, Xe, $H_2$, air, water vapor, a reactive gas, $CH_4$, $CH_xF_y$, or combination thereof.

3. The method of claim 1, the performing the first pressure-control routine comprising introducing the predetermined gas into the process chamber.

4. The method of claim 1, wherein the condition of the beamline ion implanter comprises:
a defect level;
a total number of substrates processed during the ion implantation procedure;
a total ion implanted dose over a number of substrates during the ion implantation procedure;
a measurement of film thickness of a film accumulated in the beamline ion implanter during the first time period;
a threshold capacitance value measured on an electrode of an electrostatic filter of the beamline ion implanter; or
a value for current measurement of an electrode of the electrostatic filter.

5. The method of claim 4, wherein the threshold condition comprises the defect threshold, wherein a substrate defect level is monitored in the process chamber.

6. The method of claim 5, wherein the substrate defect level is monitored by a deposition sensor or a particle counter, disposed in the process chamber.

7. The method of claim 4, wherein the threshold comprises a total ion dose of $1E19/cm^2$ to $5E20/cm^2$.

8. The method of claim 4, wherein the threshold is based upon implantation of a predetermined number of substrates.

9. The method of claim 4, wherein the performing the first pressure-control routine further comprises:
isolating a pressure of the downstream portion of the beamline ion implanter when the threshold is reached, and before the introducing the predetermined gas.

10. The method of claim 1, further comprising:
performing a second pressure-control routine after the third time period, by:
introducing the predetermined gas to reach the predetermined pressure into at least the downstream portion of the beamline for a fourth time period; and
after completion of the second pressure-control routine, performing the ion implantation procedure on a third set of substrates during a fifth time period.

11. The method of claim 10, wherein the threshold condition comprises a first threshold, wherein the second pressure-control routine is performed after a second threshold is reached, the second threshold being less than the first threshold.

12. The method of claim 11, wherein the first threshold and the second threshold are based upon a total duration of the ion implantation procedure, a total number of substrates implanted during the ion implantation procedure, a total ion dose performed during the ion implantation procedure, or a measured defect level in the beamline ion implanter, during the ion implantation procedure.

13. The method of claim 1, wherein the downstream portion of the beamline comprises an energy filter, the method further comprising using a plasma flood gun or a remote plasma source, to generate a plasma proximate to the energy filter.

14. The method of claim 13, wherein the plasma generates a plurality of metastables, radical species, or molecular species impacting walls of the process chamber, internal surfaces of the energy filter or combination thereof, in order to modify film deposits accumulated thereon.

15. A beamline ion implanter, comprising:
an ion source to generate an ion beam according to an ion implantation procedure;
a set of components to conduct the ion beam along a beam-line to a process chamber;
a pressure-control system, comprising an isolation valve and at least one inlet, disposed downstream of the isolation valve, to conduct a predetermined gas into a downstream portion of the beam-line, and a controller, wherein the controller is arranged to direct the beamline ion implanter to perform a pressure-control cycle, the pressure-control cycle comprising:
performing the ion implantation procedure during a first time period in the process chamber, wherein a condition of the beamline ion implanter is monitored to determine when a threshold condition is met after implantation of a first plurality of substrates;
when the threshold condition is met, performing a first pressure-control routine during a second time period by:
introducing a predetermined gas to reach a predetermined pressure into at least a downstream portion of the beam-line for a second time period; and
after completion of the first pressure-control routine, performing the ion implantation procedure on a second plurality of substrates during a third time period.

16. The beamline ion implanter of claim 15, wherein the at least one inlet is a process chamber inlet, a collimator inlet or an energy filter inlet, coupled to an energy filter.

17. The beamline ion implanter of claim 15, wherein the predetermined gas is nitrogen, air, Ar, Kr, Xe, $H_2$, water vapor, a reactive gas, $CH_4$, $CH_xF_y$, or combination thereof.

18. The beamline ion implanter of claim 15, wherein the controller is arranged for performing the pressure-control cycle by:
determining a threshold has been reached during the first time period; and
performing the first pressure-control routine after the threshold has been reached, wherein the threshold is based upon a duration of the first time period, a total number of substrates implanted during the first time period, a total ion dose implanted during the first time period, a defect level measured in the beamline ion implanter, a measurement of film thickness of a film accumulated in the beamline ion implanter during the first time period, a threshold capacitance value measured on an electrode of an electrostatic filter of the beamline ion implanter, or a threshold value for current measurement of an electrode of the electrostatic filter.

19. The beamline ion implanter of claim 15, wherein the pressure-control cycle further comprises:
performing a second pressure-control routine after the third time period, by:
introducing the predetermined gas to reach the predetermined pressure into at least the downstream portion of the beam-line for a fourth time period; and
after completion of the second pressure-control routine, performing the ion implantation procedure on a third plurality of substrates during a fifth time period, wherein the first pressure-control routine is performed when a first threshold is reached, wherein the second pressure-control routine is performed after a second threshold is reached, the second threshold being less than the first threshold.

20. The beamline ion implanter of claim 15, wherein the downstream portion of the beam-line comprises an energy filter, wherein the performing the first pressure-control routine further comprises: using a plasma flood gun or a remote plasma source, in order to generate a plasma proximate to the process chamber, proximate to the energy filter, or proximate to both.

\* \* \* \* \*